US009281834B1

(12) United States Patent
Waltari (10) Patent No.: US 9,281,834 B1
(45) Date of Patent: Mar. 8, 2016

(54) N-PATH INTERLEAVING ANALOG-TO-DIGITAL CONVERTER (ADC) WITH OFFSET GAIN AND TIMING MISMATCH CALIBRATION

(71) Applicant: IQ-Analog Corporation, San Diego, CA (US)

(72) Inventor: Mikko Waltari, Escondido, CA (US)

(73) Assignee: IQ-Analog Corporation, San Diego, CA (US)

(*) Notice: Subject to any disclaimer, the term of this patent is extended or adjusted under 35 U.S.C. 154(b) by 0 days.

(21) Appl. No.: 14/927,077

(22) Filed: Oct. 29, 2015

Related U.S. Application Data (63) Continuation-in-part of application No. 14/750,203, filed on Jun. 25, 2015, now Pat. No. 9,178,528, which is a continuation-in-part of application No. 14/681,206, filed on Apr. 8, 2015, now Pat. No. 9,098,072, which is a continuation-in-part of application No. 14/531,371, filed on Nov. 3, 2014, now Pat. No. 9,030,340, which is a continuation-in-part of application No. 14/511,206, filed on Oct. 10, 2014, now Pat. No. 8,917,125, which is a continuation-in-part of application No. 14/081,568, filed on Nov. 15, 2013, now Pat. No. 8,878,577, which is a continuation-in-part of application No. 13/603,495, filed on Sep. 5, 2012, now Pat. No. 8,654,000.

(51) Int. Cl.
*H03M 1/10* (2006.01)
*H03M 1/12* (2006.01)

(52) U.S. Cl.
CPC ............ *H03M 1/1023* (2013.01); *H03M 1/121* (2013.01); *H03M 1/1245* (2013.01)

(58) Field of Classification Search
CPC ......... H03M 1/50; H03M 1/502; H03M 1/60; H03M 1/1023; H03M 1/121; H03M 1/1245; G04F 10/005
USPC .......................... 341/157, 166, 136, 144, 150
See application file for complete search history.

(56) References Cited

U.S. PATENT DOCUMENTS

| | | | | |
|---|---|---|---|---|
| 7,053,804 B1* | 5/2006 | Nairn | ................... | H03M 1/0624 341/118 |
| 7,138,933 B2* | 11/2006 | Nairn | ................... | H03M 1/0626 341/141 |
| 7,466,251 B2* | 12/2008 | Uchino | ............... | H03M 1/0624 341/120 |
| 8,558,725 B2* | 10/2013 | Kidambi | ............. | H03M 1/1052 341/118 |
| 8,659,454 B2* | 2/2014 | Sugimoto | ........... | H03M 1/0836 341/118 |

* cited by examiner

*Primary Examiner* — Khai M Nguyen
(74) *Attorney, Agent, or Firm* — Law Office of Gerald Maliszewski; Gerald Maliszewski (57) ABSTRACT

A system and method are provided for calibrating timing mismatch in an n-path time interleaved analog-to-digital converter (ADC). The method digitizes an analog signal with an n-path interleaved ADC, creating an interleaved ADC signal. In a first process, the phase of the interleaved ADC signal is rotated by 90 degrees, creating a rotated signal. This rotation may be accomplished using a finite impulse response (FIR) filter with taps at {0.5, 0, −0.5}, enabled as a derivative filter, or as a Hilbert transformation. In a parallel second process, the interleaved ADC signal is delayed, creating a delayed signal. The rotated signal is multiplied by the delayed signal to create a timing error signal. Using the timing error signal, timing errors are accumulated for the ADC signal paths, and corrections are applied that minimize timing errors in each of the n ADC signal paths.

30 Claims, 8 Drawing Sheets

N-PATH INTERLEAVING ANALOG-TO-DIGITAL CONVERTER (ADC) WITH OFFSET GAIN AND TIMING MISMATCH CALIBRATION

RELATED APPLICATIONS

The following applications are incorporated herein by reference:

CURRENT IMPULSE (CI) DIGITAL-TO-ANALOG CONVERTER (DAC), invented by Mikko Waltari, Ser. No. 14/750,203, filed Jun. 25, 2015, filed Jun. 25, 2015, issued as U.S. Pat. No. 9,178,528

TRAVELING PULSE WAVE QUANTIZER, invented by Mikko Waltari, Ser. No. 14/681,206, filed Apr. 8, 2015; issued as U.S. Pat. No. 9,098,072;

N-PATH INTERLEAVING ANALOG-TO-DIGITAL CONVERTER (ADC) WITH BACKGROUND CALIBRATION, invented by Mikko Waltari, Ser. No. 14/531,371, filed Nov. 3, 2014, now U.S. Pat. No. 9,030,340;

INTERLEAVING ANALOG-TO-DIGITAL CONVERTER (ADC) WITH BACKGROUND CALIBRATION, invented by Mikko Waltari et al., Ser. No. 14/511,206, filed Oct. 10, 2014, now U.S. Pat. No. 8,917,125;

SYSTEM AND METHOD FOR FREQUENCY MULTIPLIER JITTER CORRECTION, invented by Mikko Waltari et al., Ser. No. 14/081,568, filed Nov. 15, 2013, now U.S. Pat. No. 8,878,577;

TIME-INTERLEAVED ANALOG-TO-DIGITAL CONVERTER FOR SIGNALS IN ANY NYQUIST ZONE, invented by Mikko Waltari, Ser. No. 13/603,495, filed Sep. 5, 2012, issued as U.S. Pat. No. 8,654,000 on Feb. 18, 2014.

BACKGROUND OF THE INVENTION

1. Field of the Invention

This invention generally relates to analog-to-digital converters (ADCs) and, more particularly, to a system and method for correcting timing errors in an n-path interleaved ADC.

2. Description of the Related Art

An n-path time interleaved ADC consists of n component ADCs operated in parallel and together sampling the signal n times the rate of an individual ADC. In practice, the component ADCs are never truly identical and the sampling clocks they receive can have small phase deviations from the ideal sampling phase. As a result these timing and gain errors produce artifacts which in frequency domain show up as spectral images of the desired signal centered around every multiple of fs/n, where fs is the sampling rate of the composite ADC. If the errors are known they can be corrected with either digital post-processing after the ADC, or with an analog correction circuitry in the ADC, or with some combination of the two.

One way to facilitate the error correction task is to inject a narrow band known test signal into the ADC input, in the background, while the ADC is operating normally, as described in parent application U.S. Pat. No. 8,917,125, which is incorporated herein by reference. This method works well in a two-path case where the test tone produces an image tone, which is also out-of-band and possible to detect with good accuracy. In an n-path time interleaved ADC, one test tone produces (n−1) image tones, which all need to be accurately estimated to extract all the information needed for error calibration.

It would be advantageous if gain and timing errors could be estimated from the statistics of the ADC output signal while the ADC is operating normally, without interjecting a test signal.

SUMMARY OF THE INVENTION

Disclosed herein are a system and method for estimating gain and timing errors could from the statistics generating by an analog-to-digital (ADC) output signal, while the ADC is operating normally, without interjecting a test signal. Two key components include a signal conditioning block prior to gain and timing error detection, and a novel way to determine the timing error.

Accordingly, a method is provided for calibrating timing mismatch in an n-path time interleaved ADC. The method digitizes an analog signal with an n-path interleaved ADC, creating an interleaved ADC signal. In a first process, the phase of the interleaved ADC signal is rotated by 90 degrees, creating a rotated signal. This rotation may be accomplished using a finite impulse response (FIR) filter with taps at {0.5, 0, −0.5}, enabled as a derivative filter, or as a Hilbert transformation.

In a parallel second process, the interleaved ADC signal is delayed, creating a delayed signal. The rotated signal is multiplied by the delayed signal to create a timing error signal. Using the timing error signal, timing errors are accumulated for the ADC signal paths, and corrections are applied that minimize timing errors in each of the n ADC signal paths.

In one aspect subsequent to multiplying the rotated signal by the delayed signal, the timing error signal is deinterleaved and at least (n−1) timing errors are accumulated for the correction of n ADC signal paths. The rotated signal, the delayed signal, or both the rotated and delayed signals may be passed through a conditioning filter having a transfer function with zeros at fs_ch/2 and 0 (DC), where fs_ch is the deinterleaved sampling rate (fs/n).

Alternatively, the rotated signal is deinterleaved by n and the delayed signal is deinterleaved by n. Then, each deinterleaved rotated signal is multiplied by a corresponding deinterleaved delayed signal to create deinterleaved timing error signals. Timing errors are accumulated for at least (n−1) ADC signal paths. In this case, the deinterleaved rotated signals, the deinterleaved delayed signals, and both the deinterleaved rotated signals and deinterleaved delayed signals may be passed through a conditioning filter having a transfer function with zeros at 0 (DC) and fs_ch/2.

In a parallel process, the delayed signal is multiplied by itself creating a squared signal, which is used to accumulate gain errors for the ADC signal paths, so that corrections can be applied that minimize gain errors in each of the n ADC signal paths. In a manner similar to processing the timing error signal, the squared signal may be deinterleaved to accumulate at least (n−1) gain errors for the correction of n ADC signal paths. Alternatively, the delayed signal may be deinterleaved, and each deinterleaved delayed signal multiplied by itself to create deinterleaved squared signals, to accumulate at least (n−1) gain errors for the n ADC signal paths.

Additional details of the above described method and an associated ADC with a system for calibrating timing mismatch are provided below.

DETAILED DESCRIPTION

Figure 1:
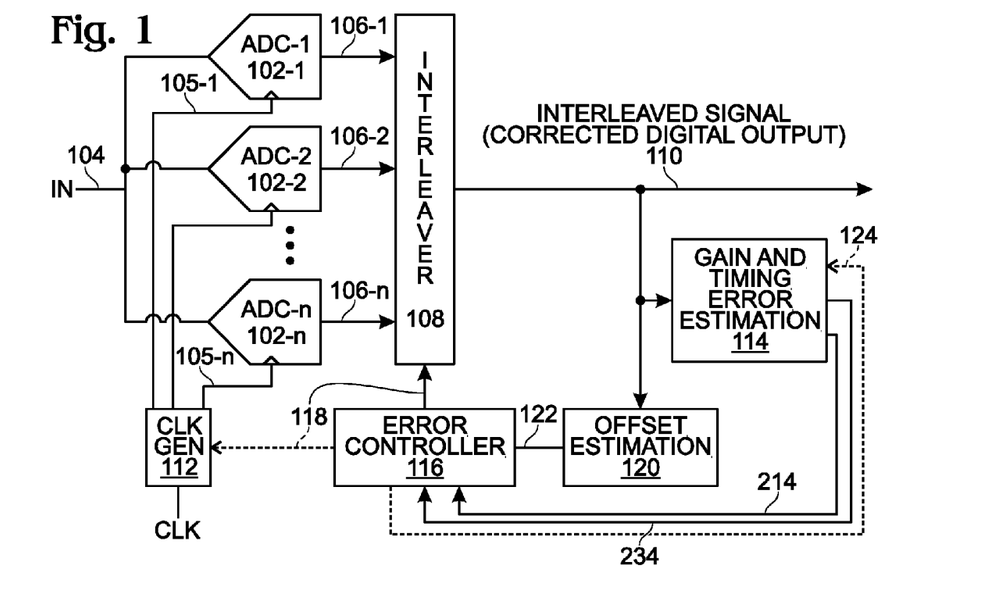
FIG. 1 is a schematic block diagram of an n-path time interleaved analog-to-digital converter (ADC) with a system for calibrating timing mismatch.

FIG. 1 is a schematic block diagram of an n-path time interleaved analog-to-digital converter (ADC) with a system for calibrating timing mismatch. The ADC 100 comprises at least n ADCs 102-1 through 102-n. Each ADC has an input on line 104 to accept the analog input, and input on lines 105-1 through 105-n to accept clock signals, and an output path, respectively 106-1 through 106-n, to supply a digital sample signal, where n is an integer greater than 1. An interleaver 108 has inputs to accept the digital sample signals on lines 106-1 through 106-n, and an output on line 110 to supply a digital n-path interleaved ADC signal. Since this path occurs after error correction, it may also be known as a corrected digital output. A clock 112 is also shown to provide n number of different phases of the sampling clock fs to the ADCs 102-1 through 102-n. The ADC 100 further comprises a gain and timing error estimation block 114. Offset estimation block 120 accepts the interleaved ADC signal on line 110 and supplies signals on line 122 for the purpose of correcting any offset mismatch between paths (channels), where offset error concerns the translation of input signal voltages to digital values.

Figure 2:
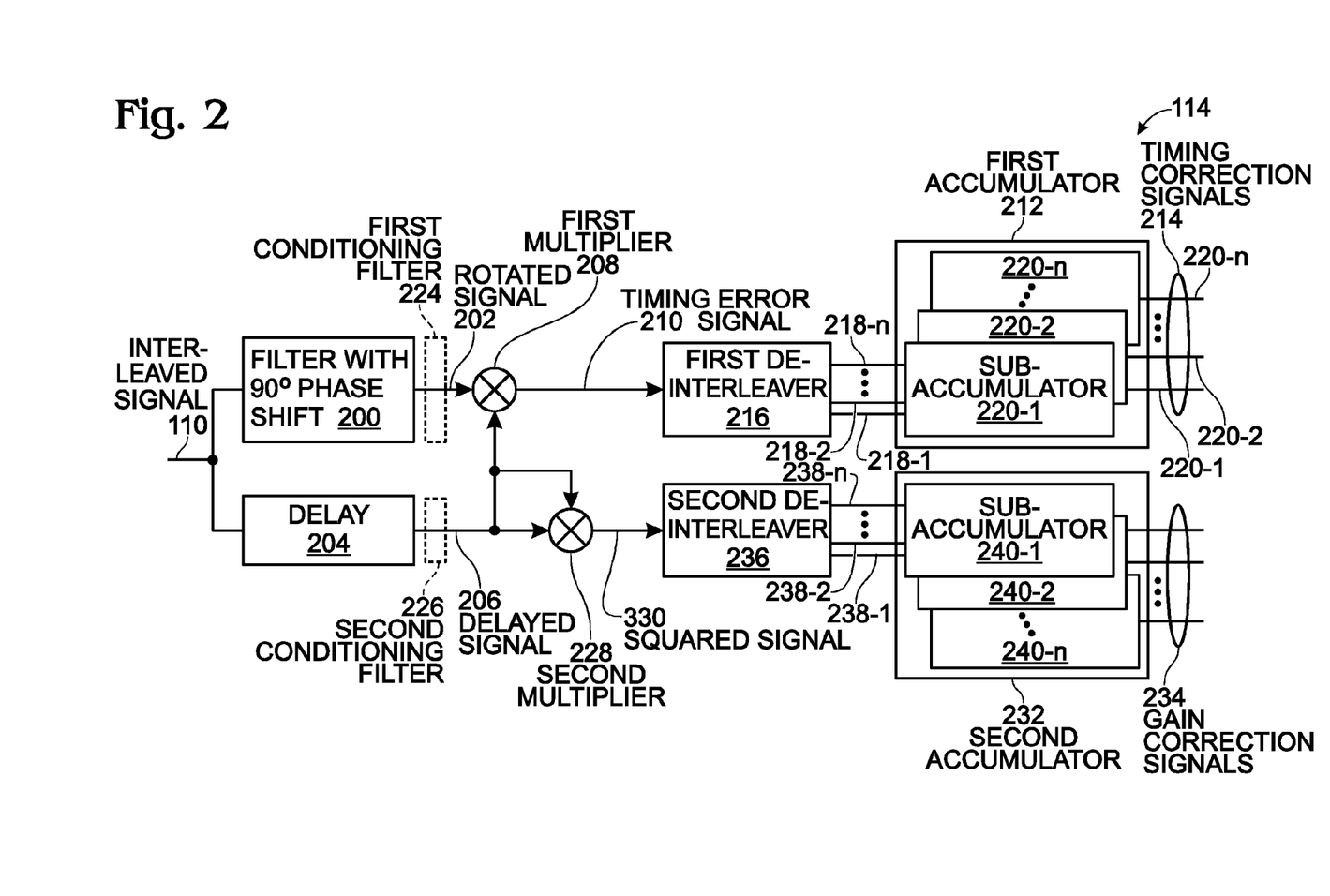
FIG. 2 is a schematic block diagram featuring aspects of the gain and timing error estimation block.

FIG. 2 is a schematic block diagram featuring aspects of the gain and timing error estimation block. A first filter 200 has an input on line 110 to accept the interleaved ADC signal. The first filter 200 rotates the phase of the interleaved ADC signal by 90 degrees and supplies a rotated signal at an output on line 202. In one aspect, the first filter 200 is a finite impulse response (FIR) filter, for example, with taps (coefficients) at {0.5, 0, −0.5}. Note: the value "0.5" is intended to represent an arbitrary value, as the gain of the FIR filter is not limited to any particular value. That is, the filter taps can be scaled by multiplying them by a common number. The scaling only affects the gain of the filter but doesn't change the poles and zeros. In other aspect, the first filter 200 may be a derivative filter or a Hilbert transformer.

A delay unit 204 has an input to accept the interleaved ADC signal on line 110. The delay unit 204 delays the interleaved ADC signal and supplies a delayed signal at an output on line 206. The delay is designed match whatever delay occurs in rotating the interleaved signal through the first filter 200. A first multiplier 208 has inputs to accept the rotated signal on line 202 and the delayed signal on line 206. The multiplier 208 multiplies the rotated signal by the delayed signal to supply a timing error signal at an output on line 210. A first accumulator 212 has an input to accept the timing error signal. The first accumulator 212 accumulates timing errors for the ADC signal paths and supplies timing correction signals at an output on line 214 to minimize timing errors in each of the ADC signal paths.

In one aspect as shown, a first deinterleaver 216 has an input on line 210 to accept the timing error signal and an output to supply deinterleaved timing error signals on lines 218-1 through 218-n. In this case, the first accumulator 212 comprises at least (n−1) timing error sub-accumulators 220-1 through 220-(n−1). In the typical case as shown, n number of accumulators is used, and the timing error signal is deinterleaved into n timing error signals. Each timing error sub-accumulator has an input to accept a corresponding deinterleaved timing error signal and an output to supply timing correction signals for a corresponding ADC path on at least lines 222-1 through 222-(n−1), grouped together as line 214.

In one aspect, one or more conditioning filters may be used. A first condition filter 224 may be interposed between the first filter 200 output and first multiplier 208 input, or a second conditioning filter 226 may interposed between the delay unit 204 output and the first multiplier 208 input. In another aspect, both the first conditioning filter 224 and the second conditioning filter 226 may be used. Each conditioning filter 224 and 226 has a transfer function with zeros at fs_ch/2 and 0 (DC), where fs_ch is the deinterleaved sampling rate (fs/2). Because of the optional use and placement of the conditioning filters, they are shown in phantom.

Figure 3:
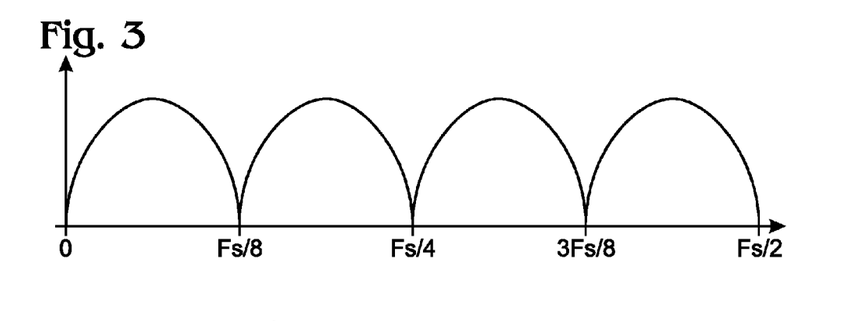
FIG. 3 is a drawing depicting an exemplary frequency response of the conditioning filters of FIG. 2, where n=4.

FIG. 3 is a drawing depicting an exemplary frequency response of the conditioning filters of FIG. 2, where n=4.

Figure 4:
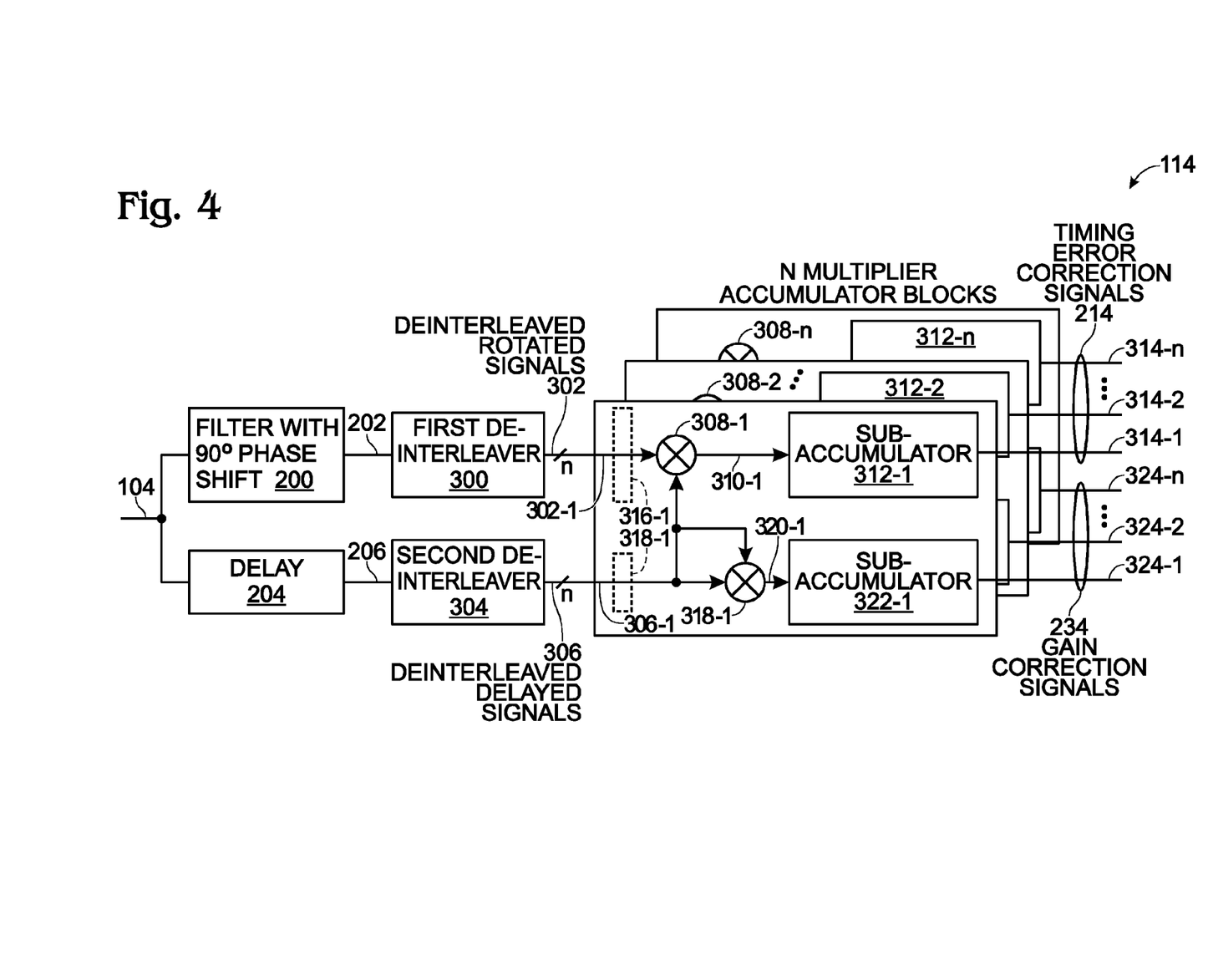
FIG. 4 is a schematic block diagram depicting a variation of the gain and timing estimation block of FIG. 1.

FIG. 4 is a schematic block diagram depicting a variation of the gain and timing estimation block of FIG. 1. As in FIG. 2, a first filter 200 and delay unit 204 accept an interleaved ADC signal on line 110 and respectively supply a rotated signal on line 202 and delayed signal on line 206. In this aspect, a first deinterleaver 300 has an input on line 202 to accept the rotated signal and an output to supply n deinterleaved rotated signals on line 302. A second deinterleaver 304 has an input on line 206 to accept the delayed signal and an output to supply n deinterleaved delayed signals on line 306. Likewise, n sub-multipliers 308-1 through 308-n are used. Each sub-multiplier has an input to accept corresponding deinterleaved rotated and deinterleaved delayed signals, and an output (line 310-1 is shown) to supply a corresponding timing error signal. At least (n−1) timing error sub-accumulators 312-1 through 312-(n−1) are used. Each timing error sub-accumulator (312-1 is shown) has an input to accept a corresponding deinterleaved timing error signal (310-1 is shown) and an output to supply at least timing correction signals (314-1 through at least 314-(n−1) for corresponding ADC paths (106-1 through at least 106-(n−1), see FIG. 1).

As in FIG. 2, conditioning filters may be used. A first set of (n conditioning filters may be used between corresponding first deinterleaver outputs and sub-multiplier inputs. For clarity, only conditioning filter (316-1 is shown). A second set of n conditioning filters may be used between corresponding second deinterleaver outputs and corresponding sub-multiplier inputs. For clarity, only conditioning filter 318-1 is shown. Alternatively, both the first and second sets of conditioning filters may be used. Each conditioning filter has a transfer function with zeros at fs_ch/2 and 0 (DC), where fs_ch is the deinterleaved sampling rate (fs/n). Because of the optional use and placement of the conditioning filters, they are shown in phantom.

Figure 5:
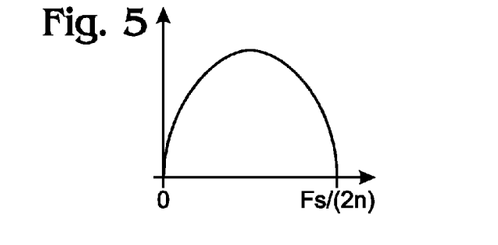
FIG. 5 is a drawing depicting an exemplary frequency response of the conditioning filter of FIG. 4.

FIG. 5 is a drawing depicting an exemplary frequency response of the conditioning filter of FIG. 4. In one aspect, the conditioning filters of FIG. 4 are FIR filters with taps at {0.5, 0, −0.5}.

Returning to FIG. 2, a second multiplier 228 has an input to accept the delayed signal on line 206. The second multiplier 228 multiplies the delayed signal by itself and supplies a squared signal at an output on line 230. A second accumulator 232 has an input to accept the squared signal on line 230. The second accumulator 232 accumulates gain errors for the ADC signal paths and supplies gain correction signals at an output on line 234 to minimize gain errors in each of the n ADC signal paths.

A second deinterleaver 236 has an input on line 230 to accept the squared signal and an output on lines 238-1 through 238-$n$ to supply deinterleaved squared signals. The second accumulator 232 comprises at least (n−1) gain error sub-accumulators 240-1 through 240-($n$−1). Each sub-accumulator has an input to accept a corresponding deinterleaved squared signal and an output to supply gain correction signals for a corresponding ADC path.

Returning to FIG. 4, n sub-multipliers are used. For clarity, only sub-multiplier 318-1 is shown. Each sub-multiplier has an input to accept a corresponding deinterleaved delay signal (306-1 is shown) and an output to supply a deinterleaved squared signal (320-1 is shown). At least (n−1) gain error sub-accumulators are used (322-1 is shown). The gain error sub-accumulators each have an input to accept a corresponding deinterleaved squared signal and respective outputs on at least lines 324-1 through 324-($n$−1) to supply gain correction signals for a corresponding ADC path. If (n−1) accumulators are used, the nth deinterleaved squared signal may be subtracted from all the other deinterleaved squared signals before accumulating, as shown in FIG. 7B.

Returning to FIG. 1, an error controller 116 has an input on line 214 to accept the timing correction signals and an input on line 234 to accept the gain correction signals. The error controller has an output on line 118 for making timing adjustments and gain adjustment. The output on line 118 also includes instructions for changing the interleaving order in which the analog input is sampled. The interleaving order may be changed periodically, randomly, or pseudo-randomly.

In one aspect, the error controller 116 selects one ADC signal path at random and interchanges an order in which it is interleaved with its immediate neighboring ADC signal path in the interleaving order. Further, the error controller 116 may control the frequency at which the order in which the n ADC signal paths are interleaved. The frequency of rotation may be periodic or random. In one aspect, the error controller supplies timing adjustment information to the clock 112 using line 118 (shown in phantom).

Figure 7A:
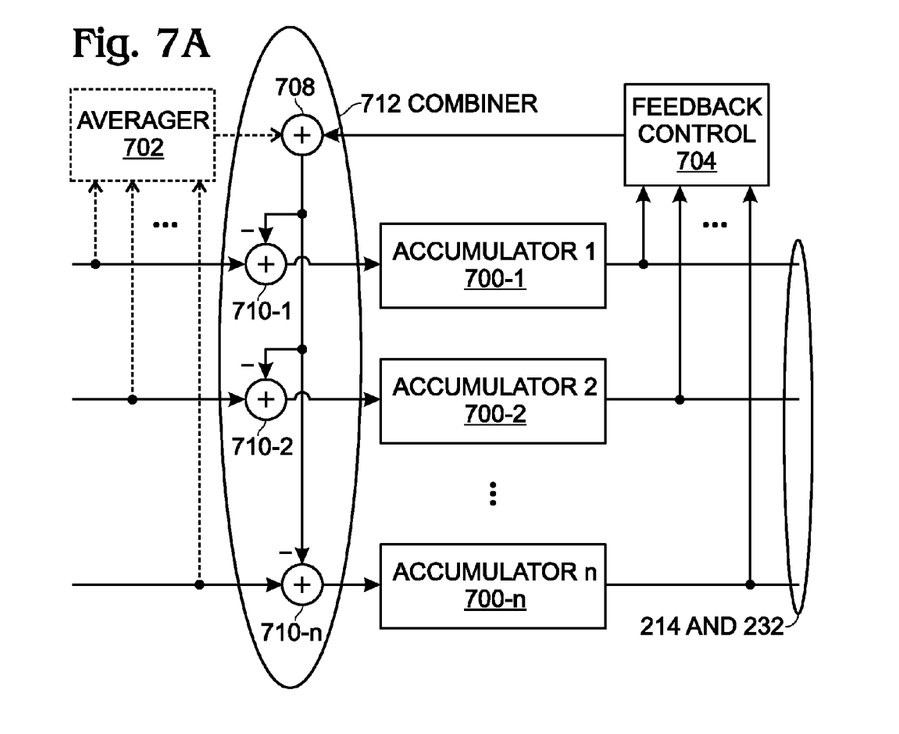
FIGS. 7A and 7B are schematic block diagrams of a system for finding a mean average error.
Figure 7B:
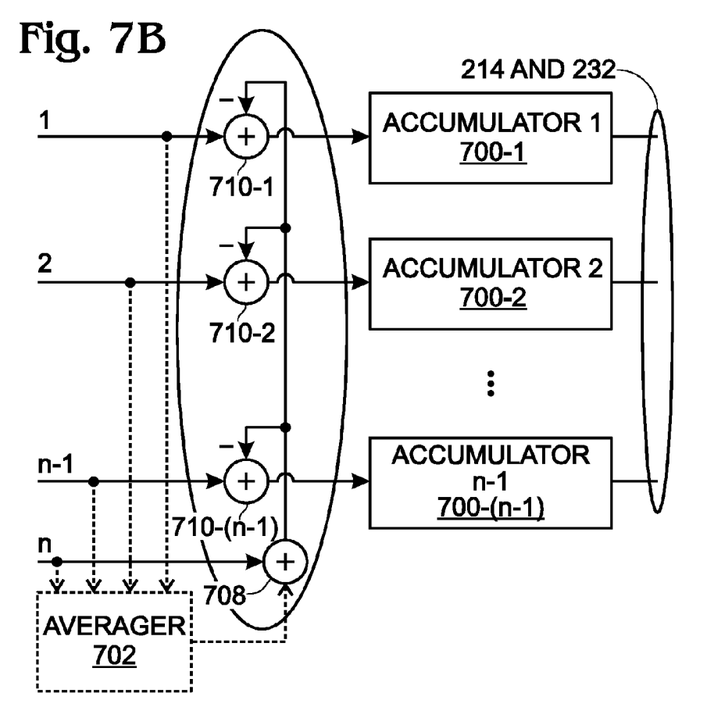

In another aspect, as shown in FIG. 7A, a mean timing error and a mean gain error are determined for the n ADC signal paths. Thus, there are n timing error sub-accumulators and n gain error sub-accumulators. For gain error corrections, an averager 702 accepts the gain error signals from the n sub-accumulators and calculates a mean gain error for the n ADC signal paths, which is summed with gain error corrections supplied by feedback control unit 704, which acts to insure that the mean error is zero. This sum on line 706 is subtracted from each gain error signal to minimize the mean error. Summer 708 and subtractrors 710-1 through 710-$n$ may be referred to collectively as combiner 712. Timing error corrections are performed in a similar manner, except that the averager and summer 708 are typically not required. As the averager and summer may be optional in some aspects, they are marked in phantom The systems described above are based on the fact that while the input signal is unknown, it usually satisfies the following conditions: it is band limited, which is required to prevent aliasing, and the signal statistics are the same for each path.

However, there are some special cases where these conditions are not true. One such case is a periodic signal with period of fs/n and another with period of fs/(2*n), where n is the order of interleaving. For instance, a sine wave with a frequency of fs/4 in 4× interleaved ADC would produce DC output for each sub-ADC and would thus be indistinguishable from a DC offset. Even when the period of the signal is not exactly fs/4 but very close, distinguishing between the signal and mismatch error is difficult and requires very long averaging time. In the second case, a signal at fs/8 produces a pattern of two repeating points in the sub-ADC outputs. This pattern can look like gain or timing mismatch. Even when the input signal is a wide band signal, but has components in these frequencies, the error detection accuracy is affected.

These problems are addressed with the use of the above-described conditioning filters. The conditioning filters remove signal from these frequencies before the gain and timing error detection by application to the corrected non-interleaved signals. In contrast, filtering the interleaved signal would make every filtered signal value be a weighted average of several consecutive samples (that come from different sub-ADCs) and thus destroy the sample-to-sub-ADC correspondence and make the error detection very difficult. Thus, the signal conditioning is performed after the error correction (after interleaver 108, see FIG. 1), as the algorithm relies on negative feedback to drive the errors to zero.

Figure 6:
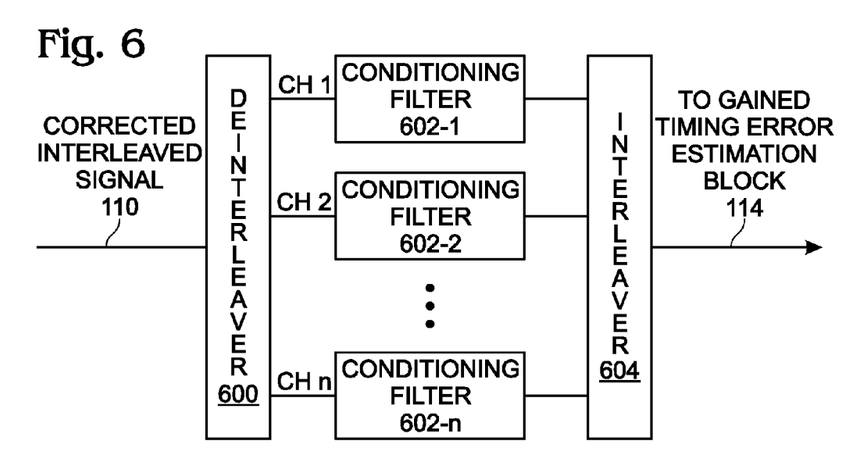
FIG. 6 depicts a variation of the ADC of FIG. 1, where the conditioning filters are positioned before the gain and timing error estimation block.

FIG. 6 depicts a variation of the ADC of FIG. 1, where the conditioning filters are positioned before the gain and timing error estimation block. If the signal is already interleaved, it has to be deinterleaved before the timing and gain errors can be accumulated, using deinterleaver 600, prior to passing through conditioning filters 602-1 through 602-$n$, and then interleaved again using interleaver 604.

The filter transfer function has a zero at fs_ch/2, or in other words at the Nyquist frequency of the sub-ADC. Note that the frequencies in this context refer to the non-interleaved signal. Such a filter can be very simple FIR filter such as the one having taps {0.5, 0, −0.5}. It is often beneficial to have a zero also at DC (again referring to non-interleaved signal), see FIG. 5. A more complex filter can produce narrower notches and be advantageous in some situations. When the filtered signals are interleaved again, the overall transfer function has zeros at the desired frequencies fs/(2*n)*k, where k is an integer that goes from 0 to n. This comb-like transfer function is shown in FIG. 3. As long as the input signal has energy outside the notches the detection algorithm has something to work with.

The error estimation follows the signal conditioning block, see FIGS. 2 and 4. The gain error estimation is based on detecting the signal power in each sub-ADC output and driving the correction circuitry to make them equal. Some prior art work uses root-mean-square for this. The method used here is similar with the distinction that the square root operation is omitted as it is costly to implement in hardware.

The timing error originates at the sampling in the front of the ADC. If the incoming ADC sampling clock has a skew (or the sampler itself causes it), the resulting voltage error is equal to the amount that the input signal has changed between the ideal sampling instant and the actual one. This change is proportional to the magnitude of the timing skew and the signal rate of change, i.e., its time derivative.

It can be shown that, if the signal with timing skew error is multiplied by its time derivative, the product has a derivative squared term that is proportional to the timing skew. This component has a non-zero mean that makes it possible obtain a timing skew estimate by averaging it. The multiplication produces other terms as well, but those have a zero mean and are averaged out.

One way to understand this is to consider the analogy of finding the signal power using the root mean square. Prior to the square root operation, the signal is multiplied by itself and averaged, which can be viewed as correlation. In the same way, when the signal is correlated with its derivative, an error free signal produces zero output, as the derivative is orthogonal to the signal. But when the signal has an error component that is proportional to the derivative, it can be detected. In the frequency domain the detected error shows up as tones at multiples of fs/n, becoming DC after deinterleaving.

To obtain the derivative, the interleaved signal is passed through a derivative filter, which can be fairly simple FIR type filter. The interleaved signal is used at this point, as the non-interleaved signals cannot be used to find the derivative of a wide band signal due to aliasing. The filter input signal is also passed through a parallel delay-only path to obtain a version of the input signal that is time aligned with the derivative filter output. These two signals are multiplied together as shown in FIG. 2. After multiplication, the signal is deinterleaved and accumulated with at least (n−1) accumulators to produce the timing error correction coefficients for at least (n−1) channels (ADC signal paths). In the case (n−1) accumulators, one of the channels is dedicated as a reference channel, against which the other channels are calibrated, and its correction coefficients are set to zero.

FIGS. 7A and 7B are schematic block diagrams of a system for finding a mean average error. In FIG. 7A, all n channels have their own accumulators 700-1 through 700-*n*, and non-zero correction coefficients as long as the average error is driven to zero. The accumulators are intended to represent both timing error and gain error accumulators. The average of the accumulator outputs is fed back to their inputs on line 706. The systems depicted in FIGS. 7A and 7B may be adapted for use with the ADCs described in either FIG. 1 or FIG. 4.

In FIG. 7B, only (n−1) accumulators are used. One ADC path (e.g., path n) is treated as a reference. This reference path error is subtracted from all the other errors prior to accumulation, and gain and timing errors are corrected for the other (n−1) paths, assuming that the nth path requires no correction.

There is essentially no difference in error information collection between n and n−1 correction signals, as the information for all n channels is always needed. Either n or (n−1) correction signals can be used because the errors are relative, not absolute. Therefore, for n channels (paths), there are only (n−1) independent parameters. However, correction values must still be obtained for all n channels. One option, as shown in FIG. 7B is to consider one (arbitrarily selected) channel ideal and make its correction values zero. The remaining (n−1) channels are corrected against the selected one. As shown in FIG. 7B, the error information from the nth channels is still needed. Another option, as shown in FIG. 7A, is to treat all the channels equally but impose an additional condition that the average error should be zero. Then, all n channels can be adjusted with an additional feedback loop driving the average to zero.

The filter used doesn't necessarily need to be a derivative filter, as it is only necessary to produce a similar phase response, which means having a 90 degree phase shift. Another suitable filter that has this property is the Hilbert transformer. There are numerous other filters that also fulfill this criterion. One very simple one is a FIR filter with taps of $\{0.5, 0, -0.5\}$.

It may seem counter-intuitive to use a corrupted signal to calculate its own derivative, as the error would appear to be indistinguishable from the signal itself. One way to understand this apparent contradiction is to consider the taps of a FIR type derivative filter. The filter has zero center tap and relatively large valued taps on the next position on both sides. This makes the derivative heavily weighted on the ADC output samples immediately before and after (i.e. samples from neighboring sub-ADCs) the sample whose error is being detected, and only weakly dependent on itself even in the two channel case. The simple 90 degree phase shift filter mentioned above doesn't use the current channel samples at all.

Timing and gain mismatch detection may be considered in the frequency domain. For a single sine wave at frequency (fin) the error produced by timing or gain mismatch appears as tones at frequencies fs/(n*k)−fin. The act of multiplying the signal by itself (squaring) or by its derivative is a mixing operation that shifts these tones to frequencies fs/n*k and the detection can be performed by sub-sampling (i.e. deinterleaving the signal) and averaging over time. In one case, the signal may not a single tone but a wide band signal that has components both at frequency f1 and at one or more of the frequencies fs/(n*k−f1). As long as the signal at those frequencies is not correlated, the method still works, albeit the required averaging time may become much longer. In many real-world situations this is the case and the method can be used. In some cases, however, some correlation may be present and the situation may occur that the input signal and the mismatch error are indistinguishable from one another.

To break this correlation, the order in which ADC channels sample the input signal may be periodically changed, as disclosed in U.S. Pat. No. 9,030,340, which is incorporated herein by reference. Disruption free channel reordering can be accomplished by either introducing one redundant channel, or in the case where n is large, designing the ADCs slightly faster than normally required to be able to tolerate shortened clock periods when phase reordering is performed.

Figure 8A:
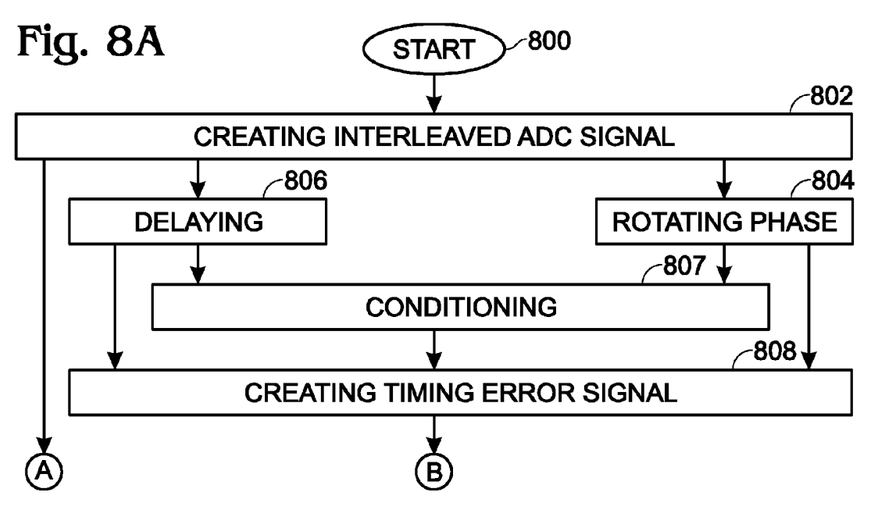
FIGS. 8A and 8B are flowcharts illustrating a method for calibrating timing mismatch in an n-path time interleaved ADC.
Figure 8B:
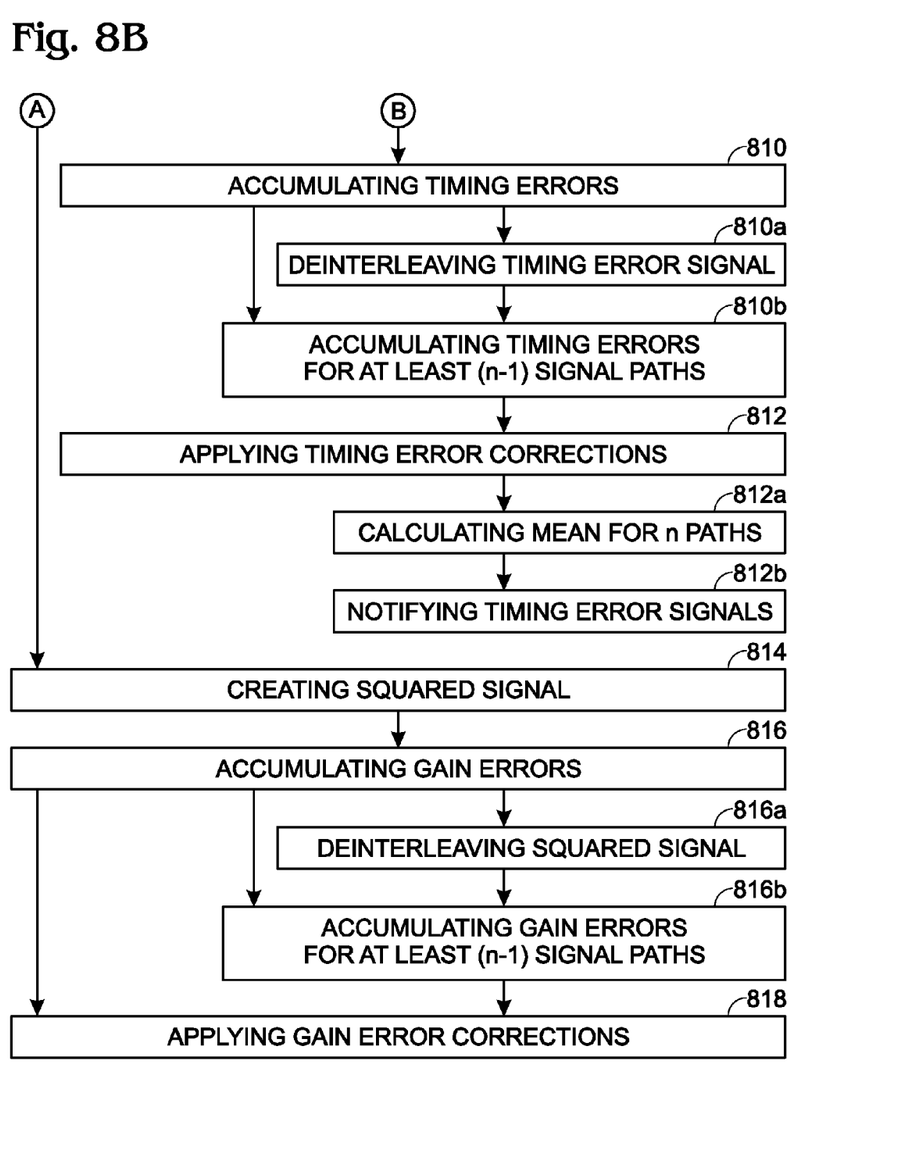

FIG. 8 is a flowchart illustrating a method for calibrating timing mismatch in an n-path time interleaved ADC. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps, and the details of the method are supported by the explanations of FIGS. 1 through 7B. The method starts at Step 800.

Step 802 digitizes an analog signal with an n-path interleaved ADC, creating an interleaved ADC signal, where n is an integer greater than 1. In a first process, Step 804 rotates the phase of the interleaved ADC signal by 90 degrees, creating a rotated signal. As noted above, this step may be performed using a FIR filter having taps at $\{0.5, 0, -0.5\}$, using a derivative filter, or performing a Hilbert transformation. In a parallel second process, Step 806 delays the interleaved ADC signal and creates a delayed signal. Step 808 multiplies the rotated signal by the delayed signal and creates a timing error signal. Step 810 uses the timing error signal to accumulate timing errors for the ADC signal paths. Step 812 applies corrections that minimize timing errors in each of the n ADC signal paths.

In one aspect, accumulating timing errors in Step 810 includes the following substeps, Step 810*a*, subsequent to multiplying the rotated signal by the delayed signal, deinterleaves the timing error signal and Step 810b accumulates timing errors for at least (n−1) ADC signal paths. In one aspect, Step 807 passes the rotated signal, the delayed signal, or both the rotated and delayed signals through a conditioning filter having a transfer function with zeros at fs_ch/2 and 0 (DC), where fs_ch is the deinterleaved sampling rate (fs/n).

In another aspect, creating the rotated signal in Step 804 includes deinterleaving the rotated signal, and created the delayed signal in Step 806 includes deinterleaving the delayed signal. Step 808 multiplies each deinterleaved rotated signal by a corresponding deinterleaved delayed signal, creating deinterleaved timing error signals. Then, Step 810b accumulates timing errors for at least (n−1) ADC signal paths. In this aspect, Step 807 optionally passes deinterleaved rotated signals, deinterleaved delayed signals, or both deinterleaved rotated signals and deinterleaved delayed signals through a conditioning filter having a transfer function with zeros at 0 (DC) and fs_ch/2. The conditioning filter may be a FIR filter having taps at {0.5, 0, −0.5}.

In one aspect, Step 814 multiplies the delayed signal by itself creating a squared signal. Step 816 uses the squared signal to accumulate gain errors for the ADC signal paths, and Step 818 applies corrections that minimize gain errors in each of the n ADC signal paths. In one variation, accumulating gain errors for the ADC signal paths in Step 816 includes substeps. Step 816a deinterleaves the squared signal and Step 816b accumulates gain errors for at least (n−1) ADC signal paths.

In a second variation, creating the delayed signal in Step 806 includes deinterleaving the delayed signal. Step 814 multiplies each deinterleaved delayed signal by itself, creating deinterleaved squared signals. Then, Step 816b accumulates gain errors for at least (n−1) ADC signal paths.

In one aspect, creating the interleaved ADC signal in Step 802 includes changing the interleaving order in which the analog input signal is sampled. The order may be changed periodically, pseudo-randomly, or randomly. In a related aspect, Step 802 may select one ADC signal path at random and interchange the order in which it is interleaved with its immediate neighboring ADC signal path in the interleaving order. The interleaving order may be changed with a periodic or random frequency.

In another aspect, accumulating timing errors for the ADC signal paths in Step 810 includes accumulating timing error for each of the n ADC signal paths. Then, applying corrections that minimize timing errors in each of the n ADC signal paths in Step 812 includes the following substeps. Step 812a calculates a mean timing error for the n ADC signal paths, and Step 812b uses the mean timing error to modify the timing error signals in a manner that minimizes the mean error.

Figure 9:
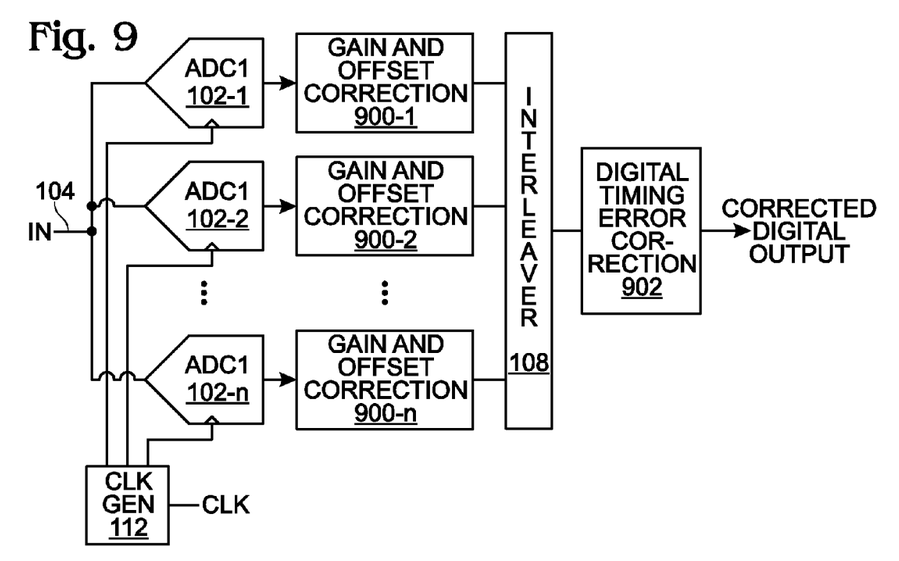
FIG. 9 is a schematic block diagram variation of FIG. 1, where digital error correction for offset and gain error is performed right after the ADCs, before the interleaver.

FIG. 9 is a schematic block diagram variation of FIG. 1, where digital error correction for offset and gain error is performed right after the ADCs 102-1 through 102-n, using blocks 900-1 through 900-n, before interleaver 108. The digital timing error correction is performed at block 902. Block 902 occurs after the interleaving due to aliasing, as at least parts of the timing error correction process require the interleaved full rate signal.

Figure 10:
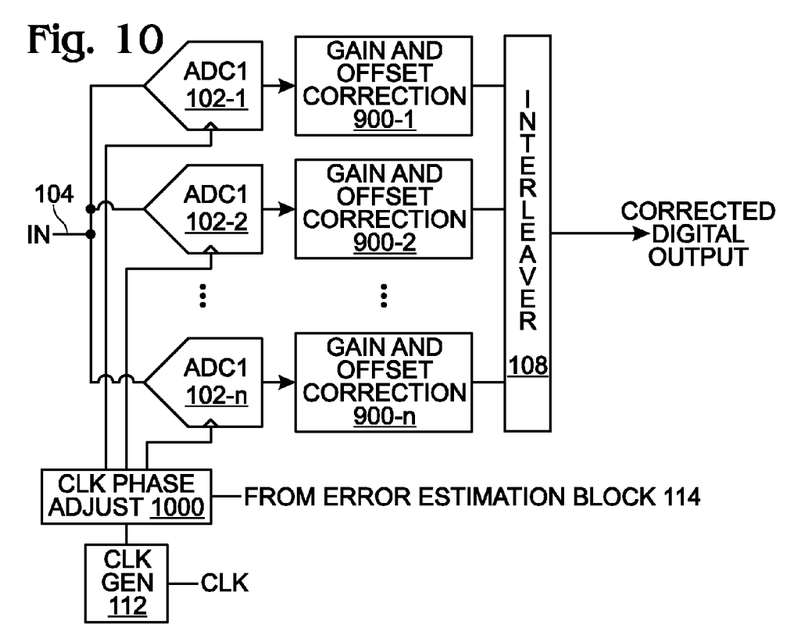
FIG. 10 is a schematic block diagram variation of FIG. 1, where the timing error correction is analog and implemented by fine adjustments of the sampling clock phases.

FIG. 10 is a schematic block diagram variation of FIG. 1, where the timing error correction is analog and implemented by fine adjustments of the sampling clock phases in block 1000.

Figure 11:
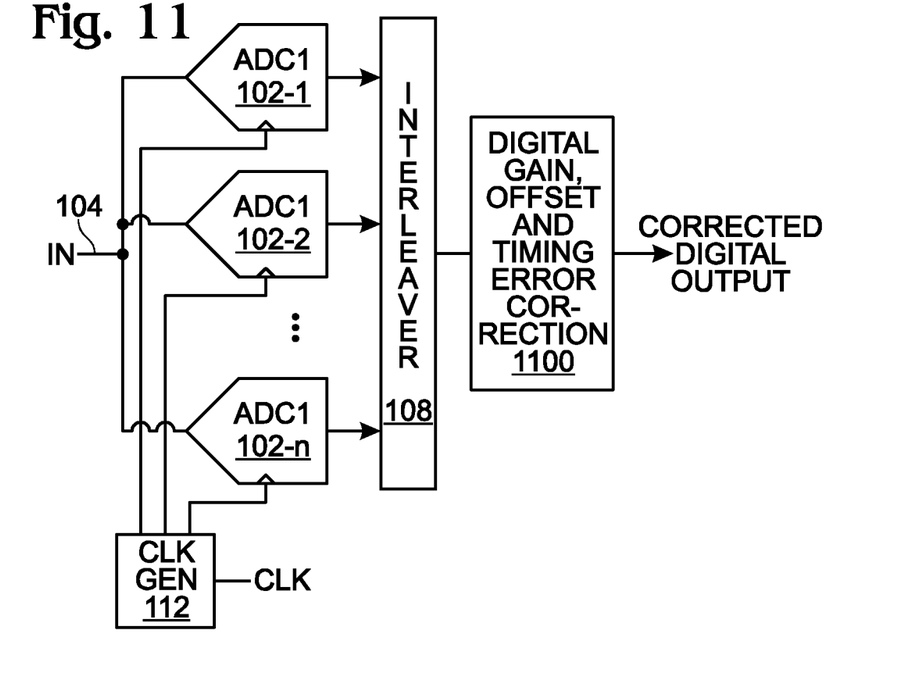
FIG. 11 is a schematic block diagram of a variation of FIG. 1, where digital error correction for interleaved signal is performed without applying corrections to the ADCs.

FIG. 11 is a schematic block diagram of a variation of FIG. 1, where digital error correction for interleaved signal is performed at block 1100 without applying corrections to the ADCs.

A system and method have been provided for calibrating timing and gain mismatch errors in an n-path interleaving analog-to-digital converter. Examples of particular message structures, processes, and modules have been presented to illustrate the invention. However, the invention is not limited to merely these examples. Other variations and embodiments of the invention will occur to those skilled in the art.

I claim:

1. A method for calibrating timing mismatch in an n-path time interleaved analog-to-digital converter (ADC), the method comprising:
   digitizing an analog signal with an n-path interleaved ADC, creating an interleaved ADC signal, where n is an integer greater than 1;
   in a first process, rotating a phase of the interleaved ADC signal by 90 degrees and creating a rotated signal;
   in a parallel second process, delaying the interleaved ADC signal and creating a delayed signal;
   multiplying the rotated signal by the delayed signal and creating a timing error signal;
   using the timing error signal, accumulating timing errors for the ADC signal paths; and,
   applying corrections that minimize timing errors in each of the n ADC signal paths.

2. The method of claim 1 wherein rotating the phase of the interleaved ADC signal includes passing the interleaved ADC signal through a finite impulse response (FIR) filter.

3. The method of claim 2 wherein passing the interleaved ADC signal through the FIR filter includes passing the interleaved signal through a derivative filter.

4. The method of claim 2 wherein passing the interleaved ADC signal through the FIR filter includes performing a Hilbert transformation.

5. The method of claim 2 wherein passing the interleaved signal through the FIR filter includes passing the interleaved signal through a FIR filter having taps at {0.5, 0, −0.5}.

6. The method of claim 1 wherein accumulating timing errors for the ADC signal paths includes:
   subsequent to multiplying the rotated signal by the delayed signal, deinterleaving the timing error signal; and,
   accumulating timing errors for least (n−1) ADC signal paths.

7. The method of claim 6 further comprising:
   passing a signal selected from a group consisting of the rotated signal, the delayed signal, or both the rotated and delayed signals through a conditioning filter having a transfer function with zeros at fs_ch/2 and 0 (DC), where fs_ch is the deinterleaved sampling rate (fs/n).

8. The method of claim 1 wherein creating the rotated signal includes deinterleaving the rotated signal;
   wherein creating the delayed signal includes deinterleaving the delayed signal;
   wherein creating the timing error signal includes multiplying each deinterleaved rotated signal by a corresponding deinterleaved delayed signal and creating deinterleaved timing error signals; and,
   wherein accumulating timing errors for the ADC signal paths includes accumulating timing errors for at least (n−1) ADC signal paths.

9. The method of claim 8 further comprising:
   passing signals selected from the group consisting of deinterleaved rotated signals, deinterleaved delayed signals, and both deinterleaved rotated signals and deinterleaved delayed signals through a conditioning filter having a transfer function with zeros at 0 (DC) and fs/2.

10. The method of claim 9 wherein passing each selected signal through a conditioning filter includes passing each selected signal through a FIR filter having taps at {0.5, 0, −0.5}.

11. The method of claim 1 further comprising:
multiplying the delayed signal by itself creating a squared signal;
using the squared signal, accumulating gain errors for the ADC signal paths; and,
applying corrections that minimize gain errors in each of the n ADC signal paths.

12. The method of claim 11 wherein accumulating gain errors for the ADC signal paths includes:
deinterleaving the squared signal; and,
accumulating gain errors for at least (n−1) ADC signal paths.

13. The method of claim 12 further comprising:
passing the delayed signal through a conditioning filter having a transfer function with zeros at fs_ch/2 and 0 (DC), where fs_ch is the deinterleaving sampling rate (fs/n).

14. The method of claim 11 wherein creating the delayed signal includes deinterleaving the delayed signal;
wherein creating the squared signal includes multiplying each deinterleaved delayed signal by itself and creating deinterleaved squared signals; and,
wherein accumulating gain errors for the ADC signal paths includes accumulating gain errors for at least (n−1) ADC signal paths.

15. The method of claim 14 further comprising:
passing each deinterleaved delayed signal through a conditioning filter having a transfer function with zeros at 0 (DC) and fs_ch/2, where fs_ch is the deinterleaved sampling rate (fs/n).

16. The method of claim 1 wherein accumulating timing errors for the ADC signal paths includes accumulating timing error for each of the n ADC signal paths; and,
wherein applying corrections that minimize timing errors in each of the n ADC signal paths includes:
calculating a mean timing error for the n ADC signal paths; and,
using the mean timing error, modifying the timing error signals being accumulated to minimize the mean error.

17. An n-path time interleaved analog-to-digital converter (ADC) with a system for calibrating timing mismatch, the ADC comprising:
at least n ADCs, each ADC having an input to accept an analog input and clock signals, and an output path to supply a digital sample signal, where n is an integer greater than 1;
an interleaver having inputs to accept the digital sample signals and an output to supply a digital n-path interleaved ADC signal;
a first filter having an input to accept the interleaved ADC signal, the first filter rotating a phase of the interleaved ADC signal by 90 degrees and supplying a rotated signal at an output;
a delay unit having an input to accept the interleaved ADC signal, the delay unit delaying the interleaved ADC signal and supplying a delayed signal at an output;
a first multiplier having inputs to accept the rotated signal and the delayed signal, the multiplier multiplying the rotated signal by the delayed signal to supply a timing error signal at an output; and,
a first accumulator having an input to accept the timing error signal, the first accumulator accumulating timing errors for the ADC signal paths and supplying timing correction signals at an output to minimize timing errors in each of the ADC signal paths.

18. The ADC of claim 17 wherein the first filter is a finite impulse response (FIR) filter.

19. The ADC of claim 18 wherein the FIR filter is a derivative filter.

20. The ADC of claim 18 wherein the FIR filter is a Hilbert transformer.

21. The ADC of claim 17 further comprising:
a deinterleaver having an input to accept the timing error signal and an output to supply n deinterleaved timing error signals; and,
wherein the first accumulator comprises at least (n−1) timing error sub-accumulators, each timing error sub-accumulator having an input to accept a corresponding deinterleaved timing error signal and an output to supply timing correction signals for a corresponding ADC path.

22. The ADC of claim 21 further comprising:
a conditioning filter selected from the group consisting of a first condition filter interposed between the first filter output and first multiplier input, and second conditioning filter interposed between the delay unit output and the first multiplier input, and both the first and second conditioning filters, where each conditioning filter has a transfer function with zeros at fs_ch/2 and 0 (DC), where fs_ch is the deinterleaved sampling rate (fs/n).

23. The ADC of claim 22 further comprising:
a conditioning filter selected from the group consisting of a first set of n conditioning filters, each interposed between corresponding first deinterleaver outputs and sub-multiplier inputs, a second set of n conditioning filters, each interposed between corresponding second deinterleaver outputs and corresponding sub-multiplier inputs, and both the first and second sets of conditioning filters, where each conditioning filter has a transfer function with zeros at fs_ch/2 and 0 (DC), where fs_ch is the deinterleaved sampling rate (fs/n).

24. The ADC of claim 17 further comprising;
a first deinterleaver having an input to accept the rotated signal and an output to supply deinterleaved rotated signals;
a second deinterleaver having an input to accept the delayed signal and an output to supply deinterleaved delayed signals;
wherein the first multiplier comprises n sub-multipliers, each sub-multiplier having inputs to accept corresponding deinterleaved rotated and deinterleaved delayed signals, and an output to supply a corresponding timing error signal; and,
wherein the first accumulator comprises at least (n−1) timing error sub-accumulators, each timing error sub-accumulator having an input to accept a corresponding deinterleaved timing error signal and an output to supply a timing correction signal for a corresponding ADC path.

25. The ADC of claim 17 further comprising:
a second multiplier having an input to accept the delayed signal, the second multiplier multiplying the delayed signal by itself and supplying a squared signal at an output; and,
a second accumulator having an input to accept the squared signal, the second accumulator accumulating gain errors for the ADC signal paths and supplying gain correction signals at an output to minimize gain errors in each of the n ADC signal paths.

26. The ADC of claim 25 further comprising:

a deinterleaver having an input to accept the squared signal and an output to supply deinterleaved squared signals; and, wherein the second accumulator comprises at least (n−1) gain error sub-accumulators, each gain error sub-accumulator having an input to accept a corresponding deinterleaved squared signal and an output to supply gain correction signals for a corresponding ADC path.

27. The ADC of claim 26 further comprising:

a conditioning filter having an input to accept the delayed signal and an output connected to the inputs of the first multiplier and second multiplier, the conditioning filter having a transfer function with zeros at fs_ch/2 and 0 (DC), where fs_ch is the deinterleaved sampling rate (fs/n).

28. The ADC of claim 25 further comprising:

a deinterleaver having an input to accept the delayed signal and an output to supply deinterleaved delayed signals;

wherein the second multiplier comprises n sub-multipliers, each sub-multiplier having an input to accept a corresponding deinterleaved delay signal and an output to supply a deinterleaved squared signals; and, wherein the second accumulator comprises at least (n−1) gain error sub-accumulators, each gain error sub-accumulator having an input to accept a corresponding deinterleaved squared signal and an output to supply gain correction signals for a corresponding ADC path.

29. The ADC of claim 28 further comprising:

n conditioning filters, each conditioning filter having an input to accept a corresponding deinterleaved delayed signal and an output connected to a corresponding sub-multiplier input, each conditioning filter having a transfer function with zeros at 0 (DC) and fs_ch/2, where fs_ch is the deinterleaved sampling rate (fs/n).

30. The ADC of claim 17 further comprising:

an error controller having inputs to accept the timing correction signals, an output for making timing adjustments, and an output for changing the interleaving order in which the analog input is sampled in a manner selected from the group consisting of periodically, randomly, or pseudo-randomly.

* * * * *